United States Patent
Hwang

(10) Patent No.: US 10,313,055 B2
(45) Date of Patent: *Jun. 4, 2019

(54) METHOD AND APPARATUS FOR TRANSMITTING AND RECEIVING PACKET IN COMMUNICATION SYSTEM

(71) Applicant: Samsung Electronics Co., Ltd., Suwon-si, Gyeonggi-do (KR)

(72) Inventor: Sung-Hee Hwang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/032,002

(22) PCT Filed: Oct. 31, 2014

(86) PCT No.: PCT/KR2014/010362
§ 371 (c)(1),
(2) Date: Apr. 25, 2016

(87) PCT Pub. No.: WO2015/065103
PCT Pub. Date: May 7, 2015

(65) Prior Publication Data
US 2016/0277146 A1    Sep. 22, 2016

(30) Foreign Application Priority Data
Oct. 31, 2013  (KR) .......................... 10-2013-0131587

(51) Int. Cl.
*H04L 1/00* (2006.01)
*H03M 13/00* (2006.01)
(Continued)

(52) U.S. Cl.
CPC .......... *H04L 1/0041* (2013.01); *H03M 13/05* (2013.01); *H03M 13/2707* (2013.01);
(Continued)

(58) Field of Classification Search
CPC ... H04L 1/0041; H04L 1/0057; H04L 12/189; H03M 13/05; H03M 13/2707; H03M 13/6356

See application file for complete search history.

(56) References Cited

U.S. PATENT DOCUMENTS 6,987,754 B2 *  1/2006  Shahar .................. H04L 1/0003
                                                    370/329
2001/0038422 A1 * 11/2001  Yamada .............. H04L 12/2805
                                                    348/478
(Continued)

FOREIGN PATENT DOCUMENTS

WO    2013/055180 A1    4/2013
WO    2013/077662 A1    5/2013

OTHER PUBLICATIONS

MPEG-H Systems, Text of ISO/IEC 2nd CD 23008-1 MPEG Media Transport, International Organisation for Standardization, Feb. 12, 2013, ISO/IEC JTC1/SC29/WG11 MPEG/N13293, XP030020043, Geneva, Switzerland.

(Continued)

*Primary Examiner* — Thien Nguyen
(74) *Attorney, Agent, or Firm* — Jefferson IP Law, LLP

(57) ABSTRACT

A method for transmitting a packet for N data streams in a communication system is provided. The method includes dividing each of the data streams into data payloads and adding a header for discriminating between the N data streams to each of the data payloads, determining, from the source packet flow, an FEC source formed by source packets generated from an (N–M) number of data streams, distinguishing at least one source packet block, generating a source symbol block from the at least one distinguished source packet block, generating a repair symbol block formed by at least one repair symbol, determining a repair flow ID for identifying a repair flow formed by the repair (Continued)

symbols generated from the FEC source packet flow, generating an FEC repair packet by adding a header to each of the repair symbols of the repair flow, and transmitting the source packet and the FEC repair packet.

3 Claims, 17 Drawing Sheets

(51) Int. Cl.
*H03M 13/05* (2006.01)
*H03M 13/27* (2006.01)
*H04L 12/18* (2006.01)

(52) U.S. Cl.
CPC ...... *H03M 13/6356* (2013.01); *H04L 1/0057* (2013.01); *H04L 12/189* (2013.01)

(56) References Cited

U.S. PATENT DOCUMENTS

| | | | |
|---|---|---|---|
| 2003/0002495 A1* | 1/2003 | Shahar | H04L 1/0003 370/389 |
| 2008/0304490 A1* | 12/2008 | Bunn | H03M 7/30 370/395.52 |
| 2009/0010259 A1* | 1/2009 | Sirotkin | H04L 47/10 370/392 |
| 2010/0050057 A1* | 2/2010 | Luby | H04L 1/0041 714/776 |
| 2010/0195646 A1* | 8/2010 | Lee | H04L 1/007 370/389 |
| 2010/0235717 A1* | 9/2010 | Nagaraj | H04L 1/0009 714/776 |
| 2012/0317461 A1 | 12/2012 | Hwang et al. | |
| 2013/0097470 A1 | 4/2013 | Hwang et al. | |
| 2013/0136193 A1 | 5/2013 | Hwang et al. | |
| 2013/0227376 A1 | 8/2013 | Hwang et al. | |
| 2013/0283132 A1 | 10/2013 | Yang et al. | |
| 2013/0283182 A1 | 10/2013 | Dadu et al. | |
| 2014/0314158 A1 | 10/2014 | Hwang et al. | |

OTHER PUBLICATIONS

Fraunhofer HHI, On FEC Signaling for MMT, International Organisation for Standardization, Oct. 31, 2013, ISO/IEC JTC1/SC29/WG11 MPEG2013/M31387, XP030059840, Geneva, Switzerland.

Fraunhofer HHI, On FEC Signaling for MMT, International Organisation for Standardization, Jan. 13, 2014, ISO/IEC JTC1/SC291WG11 MPEG107/m32600, XP030061052, San Jose, USA.

Samsung Electronics Co., Ltd., Repair FEC Payload ID for New FEC Signal & Framework, International Drganisation for Standardization, Jan. 14, 2014, ISO/IEC JTC1/SC29/WG11 MPEG2013/M32563, XP030061015, San Jose, USA.

The Chinese Examination Report dated Apr. 4, 2018, issued in the Chinese Application No. 201480059692.5.

Japanese Office Action dated Jul. 31, 2018, issued in Japanese Application No. 2016-527353.

Information technology—High efficiency coding and media delivery in heterogeneous environments—Part 1: MPEG media transport (MMT), Draft International Standard ISO/IEC DIS 23008-1, Oct. 14, 2013, pp. 32-34, 59-64, 75-85.

Japanese Examination Report dated Mar. 12, 2019, issued in Japanese Application No. 2016-527353.

* cited by examiner

FIG.10

METHOD AND APPARATUS FOR TRANSMITTING AND RECEIVING PACKET IN COMMUNICATION SYSTEM

CROSS-REFERENCE TO RELATED APPLICATION(S)

This application is a U.S. National Stage application under 35 U.S.C. § 371 of an International application filed on Oct. 31, 2014 and assigned application number PCT/KR2014/010362, which claimed the benefit of a Korean patent application filed on Oct. 31, 2013 in the Korean Intellectual Property Office and assigned Serial number 10-2013-0131587, the entire disclosure of which is hereby incorporated by reference.

TECHNICAL FIELD

The present disclosure relates to a method and an apparatus for transmitting and receiving a packet in a communication system. More particularly, the present disclosure relates to a method and an apparatus for configuring a packet for operating application layer forward error correction (AL-FEC), and transmitting and receiving the same, wherein the AL-FEC transmits a repair packet generated using one or more error correction codes together with a data packet in a communication system that supports a packet-based communication scheme, so as to improve the reliability of a network.

BACKGROUND

As various types of contents and high-capacity contents (such as high definition (HD) contents, ultra HD (UHD) contents, and the like) have increased, data congestion has become worse. Accordingly, contents sent from a sender (e.g., Host A) may not be normally transferred to a receiver (e.g., Host B), and some of the contents may get lost on route.

In general, data is transmitted based on a packet unit, and the data loss occurs based on a packet unit. The packet is formed of a single block (payload) of data to be transmitted, address information (e.g., a source address and a destination address), and management information (e.g., a header). Accordingly, the receiver may fail to receive a lost packet when the packet loss occurs over the network, and thus, may be unable to be aware of the data and the management information in the lost packet. Therefore, it causes a deterioration of audio quality, a degradation of video image quality or an image breaking, an omission of a subtitle, a loss of a file, and the like, thereby causing an inconvenience for a user.

For the reason above, there is a desire for application layer forward error correction (AL-FEC), which is a method of repairing the data loss that occurs in the network. To this end, there is a desire for a method of configuring an FEC packet and transmitting and receiving the same.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and an apparatus for configuring a packet for operating application layer forward error correction (AL-FEC), and transmitting and receiving the same, wherein the AL-FEC transmits a repair packet generated using one or more error correction codes together with a data packet in a communication system that supports a packet-based communication scheme, so as to improve the reliability of a network.

Another aspect of the present disclosure, a packet protection method and an apparatus thereof is provided, and a payload protection method and an apparatus thereof, which do not require modifying a data packet (source packet) after FEC encoding.

Another aspect of the present disclosure is to provide a signaling method, when packet protection (or payload protection), which adds a source symbol identification (SS_ID) separately to a data packet (source packet) after FEC encoding, is used in parallel.

In accordance with another aspect of the present disclosure, a method of transmitting a packet for N (an integer greater than or equal to 1) or more data streams in a communication system is provided. The method includes dividing each data stream into data payloads of a certain size, and adding, to each of the data payloads divided from each data stream, a header including ID information (packet ID) that is used for distinguishing the N or more data streams, so as to generate source packets that form a source packet flow for the N data streams, determining an FEC source packet flow that is formed of source packets that are generated from N–M data streams (M being an integer greater than or equal to 1 and less than N) out of the N data streams in the source packet flow, distinguishing at least one source packet block formed of a certain number of source packets in the determined FEC source packet flow, generating a source symbol block from the distinguished at least one source packet block, generating a repair symbol block that is formed of at least one repair symbol by applying an FEC code to the generated source symbol block, determining a repair flow ID for identifying a repair flow that is formed of the repair symbols generated by applying the FEC code, from the FEC source packet flow, generating an FEC repair packet by adding a header including the repair flow ID and an FEC repair payload ID to each repair symbol of the repair flow, and transmitting the source packet and the FEC repair packet.

Here, the header for the source packet includes a packet sequence number that is based on the ID information (packet ID) for each data stream, and the header for the FEC repair packet may include a packet sequence number that is based on the repair flow ID. The FEC repair payload ID may include at least one of information associated with the number of data streams (O data streams, O denotes a value less than or equal to N–M) that are included in a source packet block, which is protected by an FEC repair packet having the repair flow ID, a packet sequence number list (O packet sequence numbers) of a first source packet in the source packet block of each data stream (identified based on a packet ID) in the source packet block, information associated with the number of source packets for each data stream that is included in the source packet block, a packet ID list of data streams included in the source packet block, an FEC code point that is applied, an applied source symbol block generation mode (SSBG_mode), n applied FEC coding structure, information associated with the number of packets of the source packet block, information indicating a position number of the FEC repair packet in the repair packet block, and information indicating the number of FEC repair packet blocks including the FEC repair packet. Some or all out of the packet ID list, which is the ID information of data streams including the FEC repair packet in the source packet block, the applied FEC coding structure, the applied FEC code point, and the applied SSBG_mode may be included in an AL-FEC message, and may be transmitted as a separate packet. When a packet ID list, which is the ID information of the data streams included in an FEC source packet flow, is transmitted through an AL-FEC message, the AL-FEC may provide mapping information associated with a repair flow ID that protects the data streams corresponding to the packet ID list.

According to a transmitter of an embodiment of the present disclosure, an apparatus for transmitting a packet for N (an integer greater than or equal to 1) or more data streams in a communication system includes a controller that divides each data stream into data payloads of a certain size, and adds, to each of the data payloads divided from each data stream, a header including ID information (packet ID), which is used for distinguishing the N or more data streams so as to generate source packets that form a source packet flow for the N data streams, determines an FEC source packet flow that is formed of source packets that are generated from N–M data streams (M being an integer greater than or equal to 1 and less than N) out of the N data streams in the source packet flow, distinguishes at least one source packet block formed of a certain number of source packets in the determined FEC source packet flow, generates a source symbol block from the distinguished at least one source packet block, generates a repair symbol block that is formed of at least one repair symbol by applying an FEC code to the generated source symbol block, determines a repair flow ID for identifying a repair flow that is formed of the repair symbols generated by applying the FEC code, from the FEC source packet flow, and generates an FEC repair packet by adding a header including the repair flow ID and an FEC repair payload ID to each repair symbol of the repair flow, and a transmitting unit that transmits the source packet and the FEC repair packet.

Here, the header for the source packet includes a packet sequence number that is based on the ID information (packet ID) for each data stream, and the header for the FEC repair packet may include a packet sequence number based on the repair flow ID. The FEC repair payload ID may include at least one of information associated with the number of data streams (O data streams, O denotes a value less than or equal to N–M) that are included in a source packet block, which is protected by an FEC repair packet including the repair flow ID, a packet sequence number list (O packet sequence numbers) of a first source packet in the source packet block of each data stream (identified based on a packet ID) in the source packet block, information associated with the number of source packets for each data stream that is included in the source packet block, a packet ID list of data streams included in the source packet block, an applied FEC code point, an applied SSBG_mode, an applied FEC coding structure, information associated with the number of packets of the source packet block, information indicating a position number of the FEC repair packet in the repair packet block, and information indicating the number of FEC repair packet blocks including the FEC repair packet. Some or all of the packet ID, which is the ID information of data streams including the FEC repair packet in the source packet block, the applied FEC coding structure, the applied FEC code point, and the applied SSBG_mode may be included in an AL-FEC message, and may be transmitted as a separate packet. When a packet ID list, which is the ID information of the data streams included in an FEC source packet flow, is transmitted through an AL-FEC message, the AL-FEC may provide mapping information associated with a repair flow ID that protects the data streams corresponding to the packet ID list.

According to a reception method of an embodiment of the present disclosure, a method of receiving a packet in a communication system includes distinguishing whether a packet received from a transmitter is a source packet or an FEC repair packet, obtaining a repair symbol from the FEC repair packet, distinguishing source packets included in a source packet block that is protected by the FEC repair packet, based on an FEC repair payload ID of the FEC repair packet, configuring an encoding symbol block (or FEC block) through the distinguished source packets and the repair symbols, and repairing a lost source symbol by executing FEC decoding with respect to the configured encoding symbol block, and obtaining, from the source symbol, a source packet that is lost during transmission.

According to a receiver of an embodiment of the present disclosure, an apparatus for receiving a packet in a communication system may include a controller that distinguishes whether a packet received from a transmitter is a source packet or an FEC repair packet, obtains a repair symbol from the FEC repair packet, distinguishes source packets included in a source packet block that is protected by the FEC repair packet, based on an FEC repair payload ID of the FEC repair packet, configures an encoding symbol block (or FEC block) that is formed of the distinguished source packets and the repair symbols, and repairs a lost source symbol by executing FEC decoding with respect to the configured encoding symbol block, and obtains, from the source symbol, a source packet that is lost during transmission.

According to another reception method of an embodiment of the present disclosure, a method of receiving a packet in a communication system includes obtaining an AL-FEC message by receiving a packet including the AL-FEC message from a transmitter, obtaining, from the AL-FEC message, a packet ID list which is ID information of data streams included in an FEC source packet flow, and mapping information associated with a repair flow ID that protects the same, distinguishing whether a packet received from the transmitter is a source packet or an FEC repair packet, obtaining a repair symbol from the FEC repair packet, distinguishes source packets included in a source packet block that is protected by the FEC repair packet, based on an FEC repair payload ID of the FEC repair packet, configuring an encoding symbol block from the distinguished source packets and the repair symbols, repairing a source symbol by executing FEC decoding with respect to the configured encoding symbol block, and obtaining, from the repaired source symbol, a source packet of a source packet block that is lost during transmission.

According to another receiver of an embodiment of the present disclosure, an apparatus for receiving a packet in a communication system includes a controller that obtains an AL-FEC message by receiving a packet including the AL-FEC message from a transmitter, obtains, from the AL-FEC message, a packet ID list, which is ID information of data streams included in an FEC source packet flow, and mapping information associated with a repair flow ID that protects the same, distinguishes whether a packet received from the transmitter is a source packet or an FEC repair packet, obtains a repair symbol from the FEC repair packet, distinguishes source packets included in a source packet block that is protected by the FEC repair packet, based on an FEC repair payload ID of the FEC repair packet, configures an encoding symbol block from the distinguished source packets and the repair symbols, repairs a source symbol by executing FEC decoding with respect to the configured encoding symbol block, and obtains, from the repaired source symbol, a source packet of a source packet block that is lost during transmission.

According to another transmission method of an embodiment of the present disclosure, a method of transmitting a packet for N (an integer greater than or equal to 1) or more data streams in a communication system includes dividing each data stream into data payloads of a certain size, and configuring a source payload flow that is formed of the data payloads, determining an FEC source payload flow that is formed of data payloads that are generated from N−M data streams (M being an integer greater than or equal to 1 and less than N) out of the N data streams, distinguishing at least one source payload block formed of a certain number of source payloads in the determined FEC source payload flow, generating a source symbol block from the distinguished at least one source payload block, generating a repair symbol block that is formed of at least one repair symbol by applying an FEC code to the generated source symbol block, determining a repair flow ID for identifying a repair flow that is formed of the repair symbols generated by applying the FEC code, from the FEC source payload flow, generating a source packet by adding a header that includes packet ID information for identifying data streams, to each data payload of the source payload flow, generating an FEC repair packet by adding a header including the repair flow ID and an FEC repair payload ID to each repair symbol of the repair flow, and transmitting the source packet and the FEC repair packet.

Here, the header for the source packet includes a packet sequence number that is based on the ID information (packet ID) for each data stream, and the header for the FEC repair packet may include a packet sequence number based on the repair flow ID. The FEC repair payload ID may include at least one of information associated with the number of data streams (O data streams, O denotes a value less than or equal to N−M) that are included in a source payload block that is protected by the FEC repair packet having the repair flow ID, a packet sequence number list (O packet sequence numbers) of a source packet that transmits a first data payload in the source payload block of each data stream (identified by a packet ID) of the source payload block, information associated with the number of data payloads for each data stream that is included in the source payload block, a packet ID list of data streams included in the source payload block, an applied FEC code point, an applied SSBG_mode, an applied FEC coding structure, information associated with the number of payloads of the source payload block, information indicating a position number of the repair symbol in the repair symbol block, and information indicating the number of repair symbol blocks including the repair symbol. Some or all out of the packet ID list, which is the ID information of data streams including the FEC repair packet in the source payload block, the applied FEC coding structure, the applied FEC code point, and the applied SSBG_mode may be transmitted, through a separate packet, as an AL-FEC message. When a packet ID list, which is the ID information of the data streams included in an FEC source payload flow, is transmitted through an AL-FEC message, the AL-FEC may provide mapping information associated with a repair flow ID that protects the data streams corresponding to the packet ID list.

According to another transmitter of an embodiment of the present disclosure, an apparatus for transmitting a packet for N (an integer greater than or equal to 1) or more data streams in a communication system includes a controller that divides each data stream into data payloads of a certain size, and configures a source payload flow that is formed of the data payloads, determines an FEC source payload flow that is formed of data payloads that are generated from N−M data streams (M being an integer greater than or equal to 1 and less than N) out of the N data streams, distinguishes at least one source payload block formed of a certain number of source payloads in the determined FEC source payload flow, generates a source symbol block from the distinguished at least one source payload block, generates a repair symbol block that is formed of at least one repair symbol by applying an FEC code to the generated source symbol block, determines a repair flow ID for identifying a repair flow that is formed of the repair symbols generated by applying the FEC code, from the FEC source payload flow, generates a source packet by adding a header that includes packet ID information for identifying data streams, to each data payload of the source payload flow, generates an FEC repair packet by adding a header including the repair flow ID and an FEC repair payload ID to each repair symbol of the repair flow, and a transmitting unit that transmits the source packet and the FEC repair packet.

Here, the header for the source packet includes a packet sequence number that is based on the ID information (packet ID) for each data stream, and the header for the FEC repair packet may include a packet sequence number based on the repair flow ID. The FEC repair payload ID may include at least one of information associated with the number of data streams (O data streams, O denotes a value less than or equal to N−M) that are included in a source payload block, which is protected by the FEC repair packet having the repair flow ID, a packet sequence number list (packet sequence numbers O) of a source packet that transmits a first data payload in the source payload block of each data stream (identified by a packet ID) of the source payload block, information associated with the number of data payloads for each data stream that is included in the source payload block, a packet ID list of data streams included in the source payload block, an applied FEC code point, an applied SSBG_mode, an applied FEC coding structure, information associated with the number of payloads of the source payload block, information indicating a position number of the repair symbol in the repair symbol block, and information indicating the number of repair symbol blocks including the repair symbol. Some or all out of the packet ID list, which is the ID information of data streams including the FEC repair packet in the source payload block, the applied FEC coding structure, the applied FEC code point, and the applied SSBG_mode may be transmitted, through a separate packet, as an AL-FEC message. When a packet ID list which is the ID information of the data streams included in an FEC source payload flow, is transmitted through an AL-FEC message, the AL-FEC may provide mapping information associated with a repair flow ID that protects the data streams corresponding to the packet ID list.

According to another reception method of an embodiment of the present disclosure, a method of receiving a packet in a communication system includes distinguishing whether a packet received from a transmitter is a source packet or an FEC repair packet, obtaining a data payload from the source packet and obtaining a repair symbol from the FEC repair packet, configuring an encoding symbol block from data payloads, which are included in a source payload block that is protected by the FEC repair packet based on an FEC repair payload ID of the FEC repair packet, and the repair symbols, repairing a source symbol by executing FEC decoding with respect to the encoding symbol block, and obtaining, from the repaired source symbol, a source payload of a source packet that is lost during transmission.

According to another receiver of an embodiment of the present disclosure, an apparatus for receiving a packet in a communication system includes a controller that distinguishes whether a packet received from a transmitter is a source packet or an FEC repair packet, obtains a data payload from the source packet and obtains a repair symbol from the FEC repair packet, configures an encoding symbol block from data payloads, which are included in a source payload block that is protected by the FEC repair packet based on an FEC repair payload ID of the FEC repair packet, and the repair symbols, repairs a source symbol by executing FEC decoding with respect to the encoding symbol block, and obtains, from the repaired source symbol, a source payload of a source packet that is lost during transmission.

According to another reception method of an embodiment of the present disclosure, a method of receiving a packet in a communication system includes obtaining an AL-FEC message by receiving a packet including the AL-FEC message from a transmitter, obtaining, from the AL-FEC message, a packet ID list, which is ID information of data streams included in an FEC source packet flow, and mapping information associated with a repair flow ID that protects the same, distinguishing whether a packet received from the transmitter is a source packet or an FEC repair packet, obtaining a data payload from the source packet and obtaining a repair symbol from the FEC repair packet, configuring an encoding symbol block from source payloads included in a source payload block that is protected by the FEC repair packet based on the FEC repair payload ID of the FEC repair packet, and the repair symbols, repairing a source symbol by applying FEC decoding with respect to the configured encoding symbol block, and obtaining, from the repaired source symbol, a source payload of a source packet that is lost during transmission.

According to another receiver of an embodiment of the present disclosure, an apparatus for receiving a packet in a communication system includes a controller that obtains an AL-FEC message by receiving a packet including the AL-FEC message from a transmitter, obtains, from the AL-FEC message, a packet ID list, which is ID information of data streams included in an FEC source packet flow, and mapping information associated with a repair flow ID that protects the same, distinguishes whether a packet received from the transmitter is a source packet or an FEC repair packet, obtains a data payload from the source packet and obtains a repair symbol from the FEC repair packet, configures an encoding symbol block from source payloads included in a source payload block that is protected by the FEC repair packet based on the FEC repair payload ID of the FEC repair packet, and the repair symbols, repairs a source symbol by applying FEC decoding with respect to the configured encoding symbol block, and obtains, from the repaired source symbol, a source payload of a source packet that is lost during transmission.

The header of the source packet or the FEC repair packet includes information for distinguishing a source packet and an FEC repair packet. More particularly, when a packet transmission method that separately adds, to the source packet, a source symbol ID indicating the sequence of source symbols in a source symbol block, and a packet transmission method of the present disclosure are used together, the header of a source packet or an FEC repair packet, according to embodiments of the present disclosure, includes information indicating whether a corresponding packet is a source packet +SS_ID, a source packet itself, an FEC repair packet that is different from the embodiments of the present disclosure, or an FEC repair packet according to the embodiments of the present disclosure.

Table 1, as provided below, shows an embodiment of an FEC type of a motion pictures expert group (MPEG) media transport (MMT) packet header.

TABLE 1

| Value | Description |
| --- | --- |
| 0 | MMT packet without FEC Source Payload ID |
| 1 | MMT packet with FEC Source Payload ID |
| 2 | MMT packet for repair symbol(s) for FEC Payload Mode 0 (FEC repair packet) |
| 3 | MMT packet for repair symbol for FEC Payload Mode 1 (FEC repair packet) |

NOTE:
If FEC type is set to 0, it indicates that FEC is not applied to this MMT packet or that FEC is applied to this MMT packet without adding FEC Source Payload ID. In the latter case, the combination of packet_sequence_number and packet_id in this packet identify the location of this MMT packet within Source Packet Block which is identified by the FEC repair payload ID of its associated FEC repair packet (e.g., replacement of SS_ID).

In addition, the packet distinguishing information has a Payload ID_Mode Flag that indicates whether an FEC that is different from the embodiments of the present disclosure is to be applied or whether an FEC, according to the embodiments of the present disclosure, is to be applied when packet transmission is performed, and is transmitted through an AL-FEC message with respect to a receiving end.

When Payload ID_Mode Flag=1, it indicates the packet transmission method to which the FEC, according to the embodiments of the present disclosure, is applied. For example, the method does not use a separate SS_ID for a source packet, information included in the source packet may be substituted for the SS_ID, and an FEC repair packet format (particularly, FEC repair payload ID) according to the embodiments of the present disclosure may be used.

When Payload ID_Mode Flag=0, it indicates the packet transmission method to which the FEC that is different from the embodiments of the present disclosure is applied. For example, a separate SS_ID is added to a source packet, and a general FEC repair packet format (particularly, FEC repair payload ID) is used.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 10 is a flowchart illustrating operations of configuring a source symbol block according to an embodiment of the present disclosure.

Throughout the drawings, like reference numerals will be understood to refer to like parts, components, and structures.

DETAILED DESCRIPTION

Figure 1A:
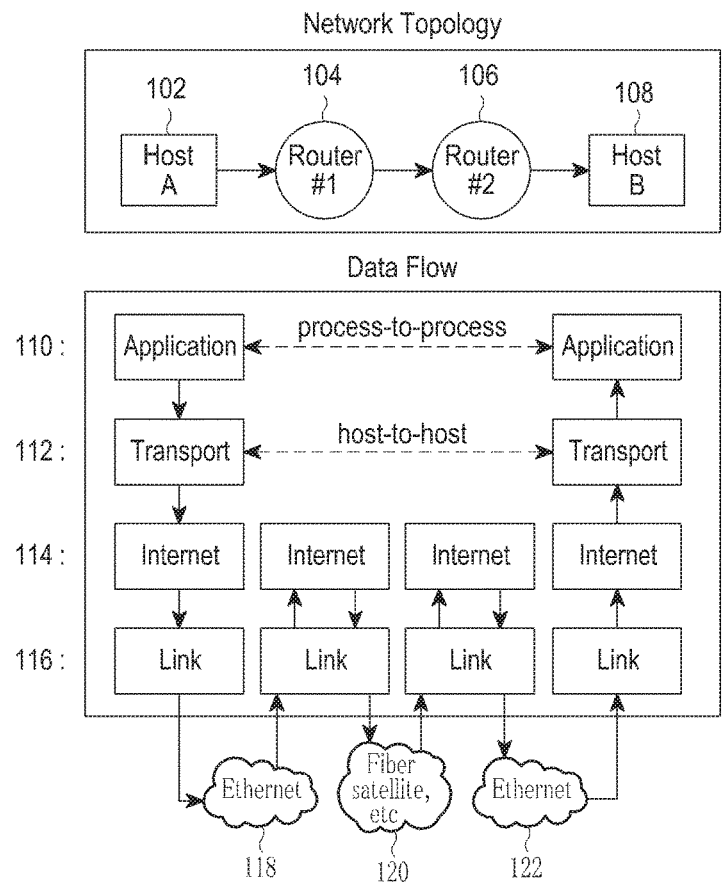
FIGS. 1A and 1B are diagrams illustrating a network topology and a data flow according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

First, the terminologies used in the present disclosure are listed in Table 2 as provided below.

TABLE 2

| Terms | Descriptions |
| --- | --- |
| access unit | smallest media data entity to which timing information can be attributed |
| asset | any multimedia data entity that is associated with a unique identifier and that is used for building a multimedia presentation |
| code rate | ratio between the number of source symbols and the number of encoding symbols |
| encoding symbol | unit of data generated by the encoding process |
| encoding symbol block | set of encoding symbols |
| FEC code | algorithm for encoding data such that the encoded data flow is resilient to data loss |
| FEC encoded flow | logical set of flows that consist of an FEC source flow and one or more associated FEC repair flows |
| FEC payload ID | identifier that identifies the contents of a MMT packet with respect to the MMT FEC scheme |
| FEC repair flow | data flow carrying repair symbols to protect and FEC source flow |
| FEC repair packet | MMT packet along with repair FEC payload identifier to deliver one or more repair symbols of a repair block |

TABLE 2-continued

| Terms | Descriptions |
| --- | --- |
| FEC source flow | flow of MMT packet protected by an MMT FEC scheme |
| FEC source packet | MMT packet along with source FEC payload identifier |
| media fragment unit | fragment of a media processing unit |
| media processing unit | generic container for independently decodable timed or non-timed data this is media codec agnostic |
| MMT entity | software and/or hardware implementation that is compliant to a profile of MMT |
| MMT FEC scheme | forward error correction procedure that defines the additional protocol aspects required to use an FEC scheme in MMT |
| MMT packet | formatted unit of the media data to be delivered using the MMT protocol |
| MMT payload | formatted unit of media data to carry MMT packages and/or signaling messages using either the MMT protocol or an Internet application layer transport protocols (e.g. RTP) |
| MMT protocol | application layer transport protocol for delivering MMT payload over IP networks |
| MMT receiving entity | MMT entity that receives and consumes media data |
| MMT sending entity | MMT entity that sends media data to one or more MMT receiving entities |
| non-timed data | media data that do not have inherent timeline for the decoding and/or presenting of its media content |
| package | logical collection of media data, delivered using MMT |
| repair FEC payload ID | FEC payload ID for repair packets |
| repair symbol | encoding symbol that contains redundancy information for error correction |
| repair symbol block | set of repair symbols which can be used to recover lost source symbols |
| source FEC payload ID | FEC payload ID for source packets |
| source packet block | segmented set of FEC source flow that is to beprotected as a single block |
| source symbol | unit of data to be encoded by an FEC encoding process |
| source symbol block | set of source symbols generated from a single source packet block |
| timed data | any data that has inherent timeline information for the decoding and/or presentation of its media contents |

Hereinafter, 'parity' and 'repair' are interchangeably used to indicate the same meaning.

Figure 1B:
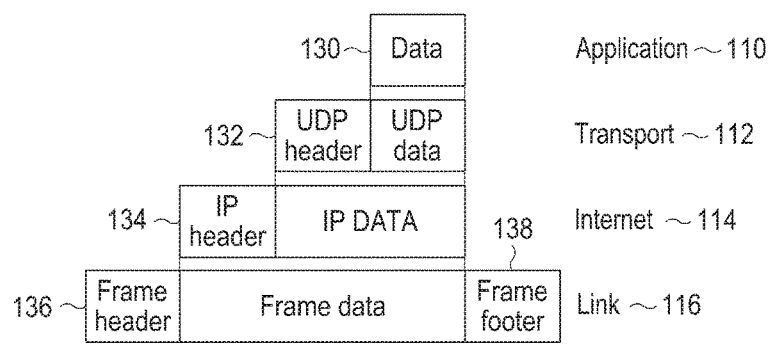

FIGS. 1A and 1B are diagrams illustrating a network topology and a data flow according to an embodiment of the present disclosure.

Referring to FIG. 1A, the network topology includes a host A 102 that operates as a transmitter and a host B 108 that operates as a receiver, and the host A 102 and the host B 108 may be connected through one or more routers 104 and 106. The host A 102 and the host B 108 are connected to the routers 104 and 106 through Ethernet 118 and 122, and the routers 104 and 106 are connected to each other through an optical fiber, satellite communication, or other possible means 120. A data flow between the host A 102 and the host B 108 may proceed through a link layer 116, an Internet layer 114, a transport layer 112, and an application layer 110.

Referring to FIG. 1B, the application layer 110 may generate data 130 to be transmitted, through an application layer forward error correction (AL-FEC). The data 130 may be real time protocol (RTP) packet data that is obtained by dividing data that is compressed in an audio/video (AV) codec end using a RTP, or Motion Pictures Expert Group (MPEG) media transport (MMT) packet data according to MMT. By the transport layer 112, the data 130 may be converted into, for example, a user datagram protocol (UDP) packet 132 to which a UDP header is inserted. The internet layer 114 may generate an Internet protocol (IP) packet 134 by adding an IP header to the UDP packet 132, and the link layer 116 may configure a frame 116 to be transmitted by adding, to the IP packet 134, a frame header 136 and a frame footer 138 as needed.

Figure 2:
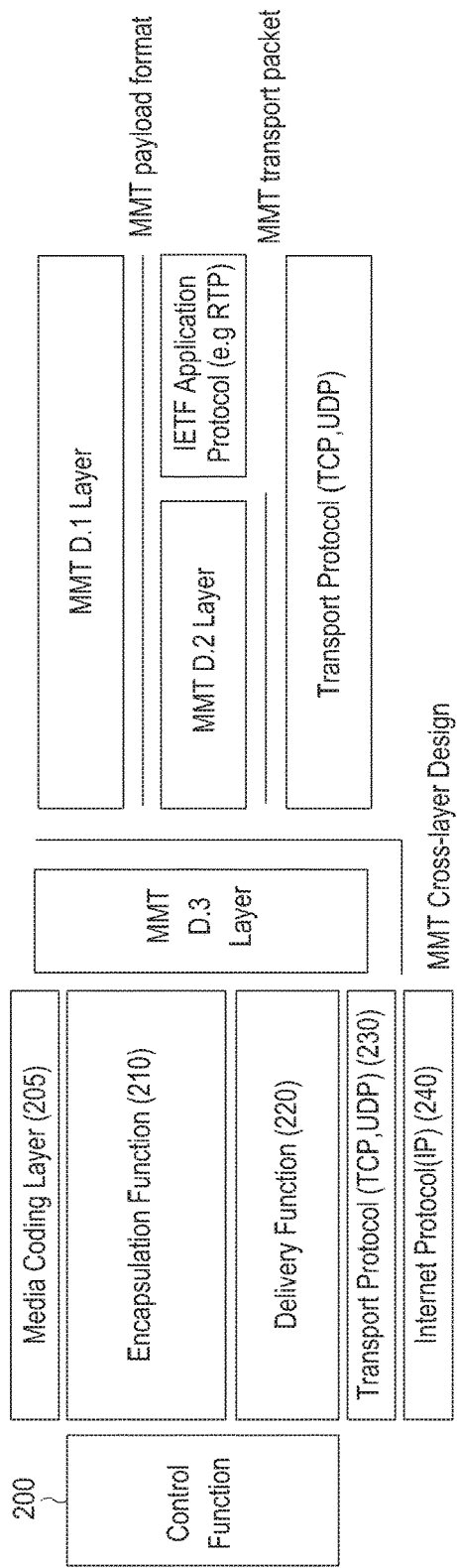
FIG. 2 is a block diagram illustrating a Motion Pictures Expert Group (MPEG) media transport (MMT) system according to an embodiment of the present disclosure.

FIG. 2 is a block diagram illustrating a MMT system according to an embodiment of the present disclosure.

Referring to FIG. 2, the diagram on the left of FIG. 2 illustrates the configuration of an MMT system, and the diagram on the right of FIG. 2 illustrates the detailed structure of a delivery function.

A media coding layer 205 compresses audio and/or video data, and transmits the compressed data to an encapsulation function layer (E. layer) 210.

The encapsulation function layer 210 packages the compressed audio/video data in the form similar to a file format, and transfers the same to a delivery function layer 220.

The delivery function layer (or D layer) 220 formats an output of the encapsulation function layer 210 into an MMT payload, adds an MMT transmission packet header thereto, and transmits the same in the form of an MMT transmission packet to a transport protocol layer 230. Alternatively, the delivery function layer 220 transfers, to the transport protocol layer 230, the output of the encapsulation function layer 210 in the form of an RTP packet using an existing RTP protocol. Subsequently, the transport protocol layer 230 converts the same using one transmission protocol out of the UDP and the transmission control protocol (TCP), and transmits the same to an IP layer 240. The IP layer 240 converts the output of the transport protocol layer 230 into an IP packet, and transmits the same using an IP protocol.

According to an embodiment of the present disclosure, protection of a multimedia multiplexing transport protocol (MMTP) packet, an MMT payload, or payload data is possible.

A control function layer (C. layer) 200 manages a presentation session and a delivery session.

Figure 3:
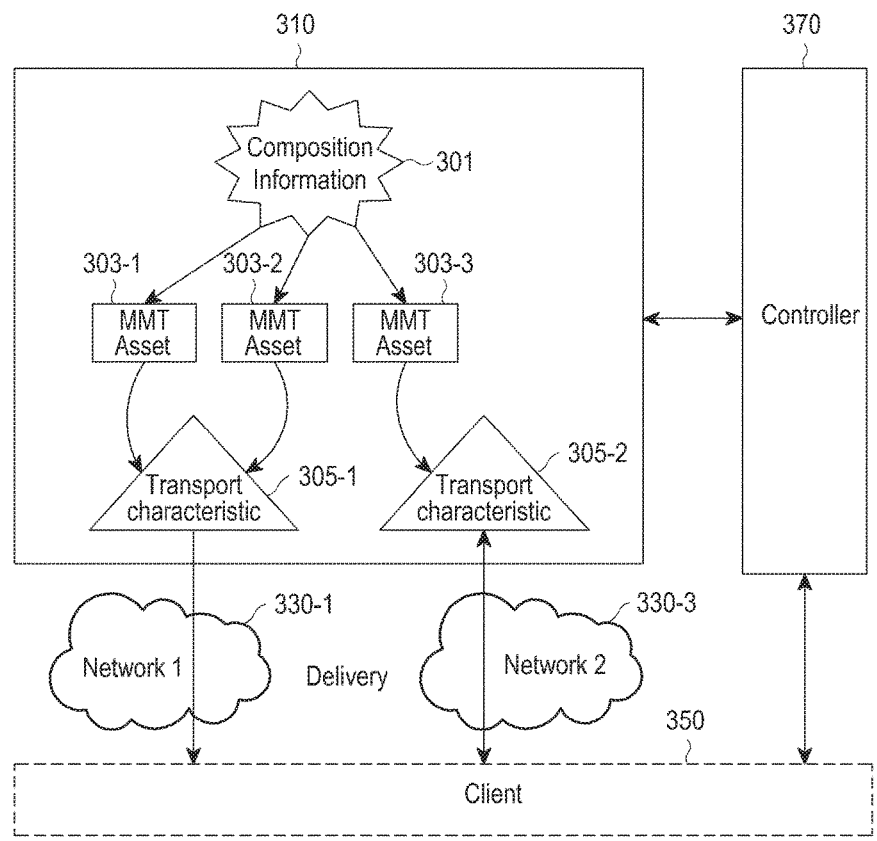
FIG. 3 is a diagram illustrating a structure of an MMT packet according to an embodiment of the present disclosure.

FIG. 3 is a diagram illustrating a structure of an MMT package according to an embodiment of the present disclosure.

Referring to FIG. 3, an MMT package 310 is transmitted and received to/from a client 350 through a delivery function layer (D. layer) 330-1 and 330-2 of a network, and may include MMT assets 303-1 to 303-3, composition information 301, and transport characteristics 305-1 and 305-2. The MMT package 310 and the client 350 can communicate with a controller 370.

In addition, the MMT package 310 may include functionality and operations for utilizing configuration information. The configuration information may be formed of a list of the MMT assets 303-1 to 303-3, the composition information 301, and the transport characteristics 305-1 and 305-2.

Description information describes the MMT package 310 and the MMT assets 303-1 to 303-3. The composition information 301 may help the consumption of the MMT assets 303-1 to 303-3. The transport characteristics 305-1 and 305-2 may provide a hint for transferring the MMT assets 303-1 to 303-3.

The MMT package 310 describes a transport characteristic for each MMT asset. The transport characteristics 305-1 and 305-2 include error resiliency information, and simple transport characteristic information for a single MMT asset may or may not be lost. In addition, transport characters 305-1 and 305-2 may include quality of service (QOS); a permissible degree of loss and a permissible degree of delay) of each MMT asset.

Figure 4:
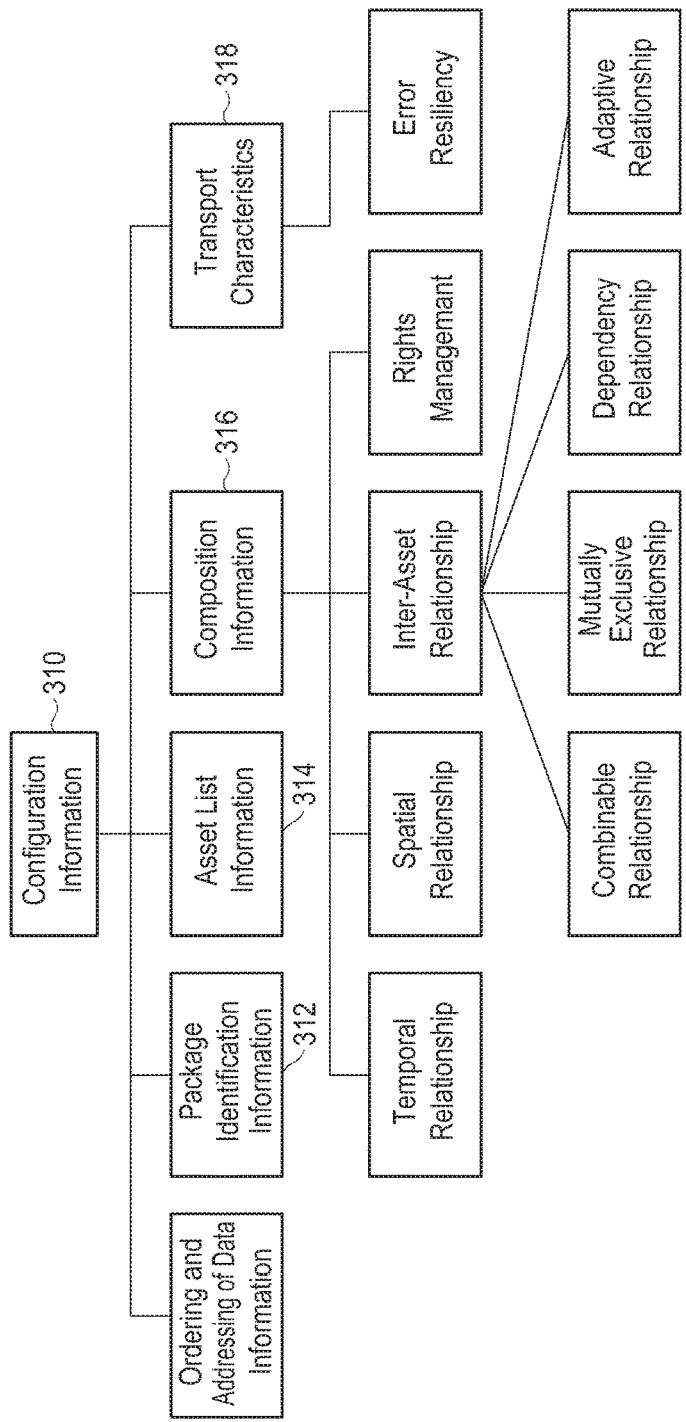
FIG. 4 is a diagram illustrating a structure of configuration information included in an MMT package according to an embodiment of the present disclosure.

FIG. 4 illustrates a structure of configuration information and subordinate information thereof, included in an MMT package according to an embodiment of the present disclosure.

Referring to FIG. 4, the configuration information includes package identification information 312, asset list information 314 associated with assets that form the package, composition information 316, transport characteristics 318, contents, and additional information, and may provide structural information that indicates where and how the component elements are included in the package.

Figure 5A:
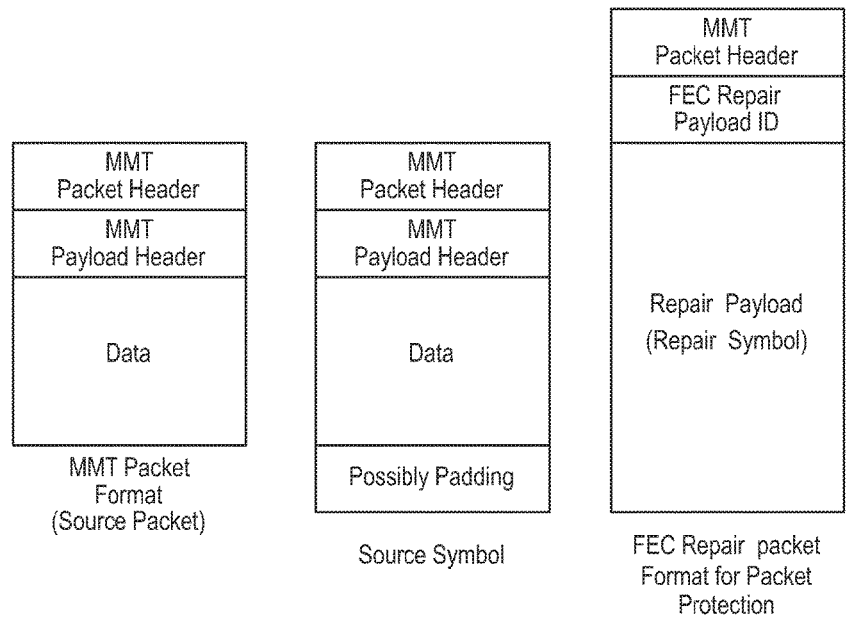
FIG. 5A is a block diagram illustrating formats of a source packet, a source symbol, and a forward error correction (FEC) repair packet according to an embodiment of the present disclosure.

FIG. 5A is a block diagram illustrating formats of a source packet, a source symbol, and an FEC repair packet according to an embodiment of the present disclosure.

Referring to FIG. 5A, a source packet (=MMTP packet) is formed of an MMT packet header, an MMT payload header, and a payload (data). A source symbol is generated by adding a possibly padding to a source packet. An amount of padding data (all 00h), which is given by an AL-FEC message or corresponds to a difference from a certain size of a repair symbol, may be added. An FEC repair packet may be formed of a repair symbol that is generated from a source symbol block through an MMT packet header, an FEC repair payload ID, and FEC encoding.

Figure 5B:
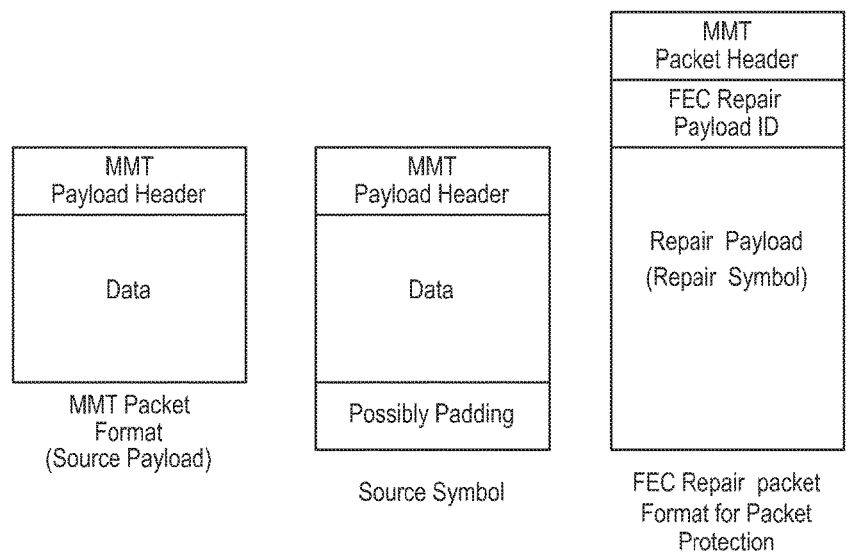
FIGS. 5B and 5C are block diagrams illustrating formats of a source payload, a source symbol, and an FEC repair packet according to an embodiment of the present disclosure.

FIG. 5B is a block diagram illustrating formats of a source payload, a source symbol, and an FEC repair packet according to an embodiment of the present disclosure.

Referring to FIG. 5B, a source Payload (=MMT Payload) is formed of an MMT payload header and a payload (data). A source symbol is generated by adding a possibly padding to a source payload. An amount of padding data (all 00h), which is given by an AL-FEC message or corresponds to a difference from a certain size of a repair symbol, may be added. An FEC repair packet may be formed of a repair symbol that is generated from a source symbol block through an MMT packet header, an FEC repair payload ID, and FEC encoding.

Figure 5C:
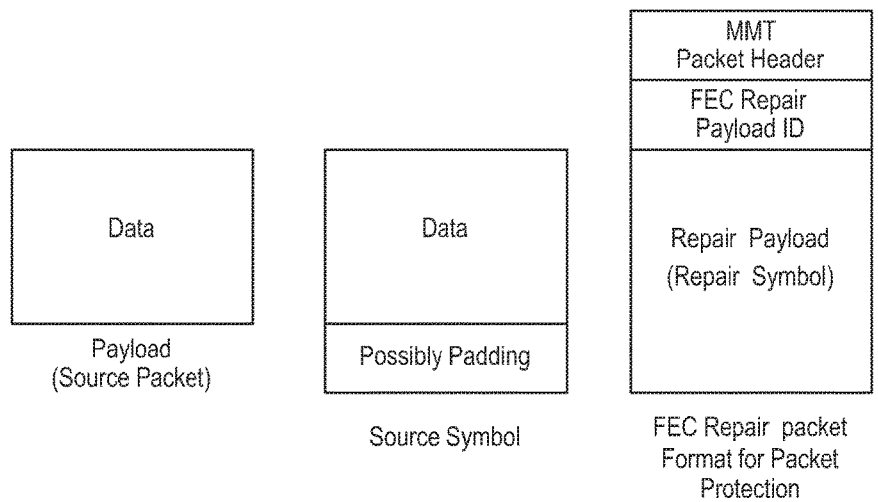

FIG. 5C is a block diagram illustrating formats of a source payload, a source symbol, and an FEC repair packet according to an embodiment of the present disclosure.

Referring to FIG. 5C, a source payload (=MMT Payload) is formed of an MMT payload header and a payload (data). A source symbol is generated by adding a possibly padding to a source payload. An amount of padding data (all 00h), which is given by an AL-FEC message or corresponds to a difference from a certain size of a repair symbol, may be added. An FEC repair packet may be formed of a repair symbol that is generated from a source symbol block, through an MMT packet header, an FEC repair payload ID, and FEC encoding.

Figure 6A:
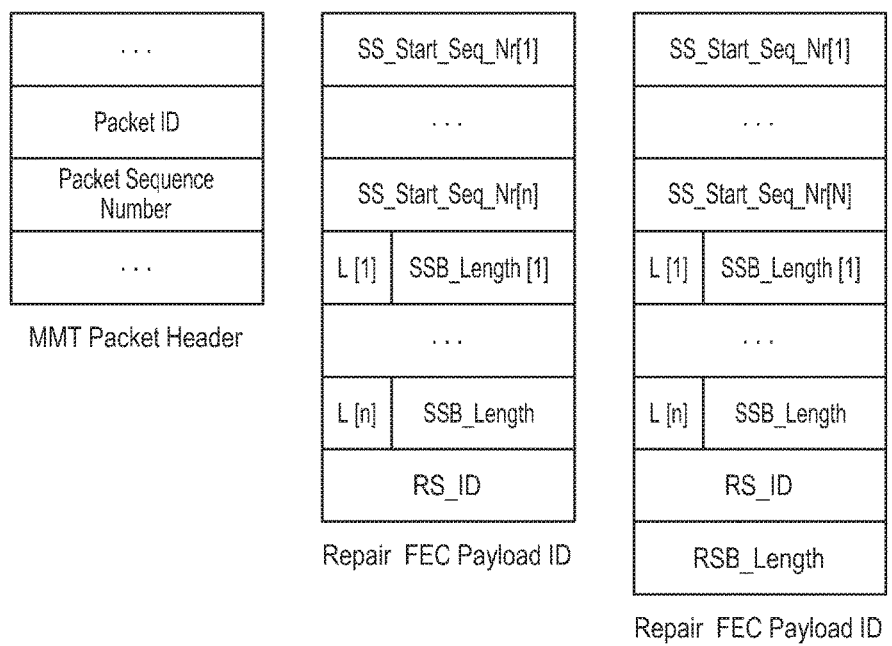
FIG. 6A is a diagram illustrating formats of an MMT packet header and an FEC repair payload identification (ID) according to an embodiment of the present disclosure.

FIG. 6A is a diagram illustrating formats of an MMT packet header and an FEC repair payload ID according to an embodiment of the present disclosure.

An MMT packet header for a source packet and an FEC repair packet may include a packet_ID field and a packet sequence number field.

Referring to FIG. 6A, the packet_ID sets information identifying a data stream that includes a payload that a corresponding MMTP packet transmits. When the corresponding MMTP packet transmits data of an asset, a packet_ID that is mapped to an asset ID of the asset through a message package table (MPT) of a signaling message, is set in the field. When the corresponding MMTP packet transmits a repair symbol of a repair flow, a packet_ID that is mapped to a repair flow ID through an AL-FEC message, is set in the field.

The packet sequence number indicates the sequence numbers of the packets having an identical packet_ID value. When an asset is transmitted, a sequence number increases by 1 from a number based on a transmission order of the packets that transmit data of the corresponding asset.

An FEC repair payload ID includes SS_Start_Seq_Nr [1] to SS_Start_Seq_Nr [n], L[1]/SSB_Length [1] to L[n]/SSB_Length [n], repair symbol ID (RS_ID), and additionally includes RSB_Length for block codes based an FEC code (e.g., low density parity check (LDPC), RS) (when a rateless FEC code, such as Raptor or RaptorQ uses RSB_Length, the number of lost repair symbols of a repair symbol block may be measured from RSB_Length).

SS_Start_Seq_Nr [i] (i=1, 2, . . . , # of packet_IDs) sets a packet sequence number of a first source packet in a source packet block of an $i^{th}$ data stream out of data streams included in the source packet block that is protected by the FEC repair packet. The sequence of data streams is identical to the order of packet_IDs listed for a source packet flow, which are mapped to a packet_ID set in the FEC repair packet, which is provided from the AL-FED Message.

L[i] is assigned with 2 bits, and a value for adjusting the size of SSB_Length Field.

SSB_Length [i] (="6+8×L[i]" bits) (i=1, 2, . . . , # of packet_IDs) indicates the number of source symbols for $i^{th}$ data streams out of the data streams included in a source packet block protected by an FEC repair packet.

RS_ID indicates a position number of a repair symbol of the FEC repair packet in a repair symbol block, and starts from 0 and increases by 1.

RSB_Length indicates the number of repair symbols included in a repair packet block including the FEC repair packet.

The sequence of data streams is identical to the order of packet_IDs listed for a source packet flow, which are mapped to corresponding packet_IDs set in the FEC repair packet, which is provided from the AL-FED Message.

Figure 6B:
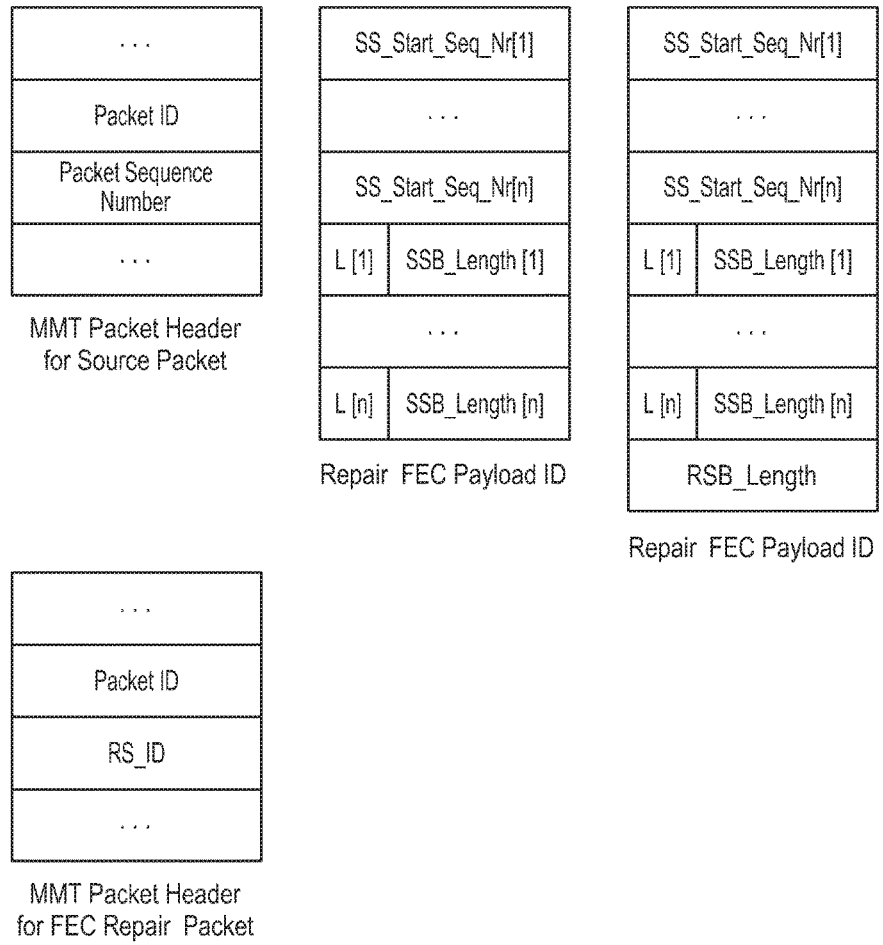
FIG. 6B is a diagram illustrating formats of an MMT packet header for a source packet, an MMT packet header for an FEC repair packet, and an FEC repair payload ID thereof, according to an embodiment of the present disclosure.

FIG. 6B is a diagram illustrating formats of an MMT packet header for a source packet, an MMT packet header for an FEC repair packet, and an FEC repair payload ID thereof according to an embodiment of the present disclosure.

Referring to FIG. 6B, the descriptions thereof are identical to that of FIG. 6A, except that a packet sequence number of an MMT packet header for an FEC repair packet is changed with an (RS_ID) of an FEC repair payload ID.

Figure 6C:
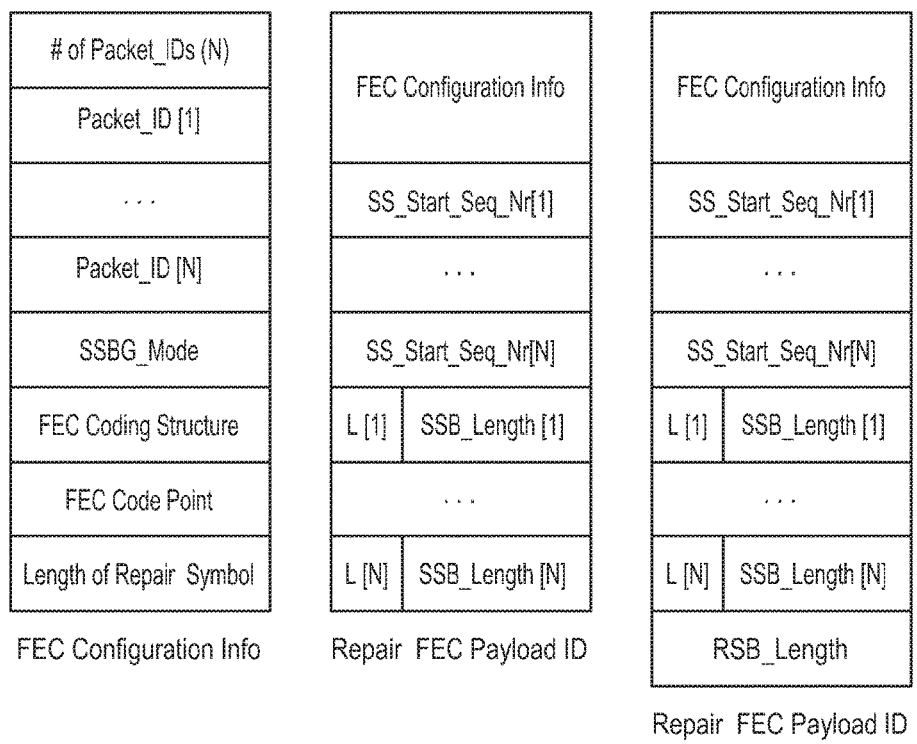
FIG. 6C is a diagram illustrating a format of an FEC repair payload ID including FEC configuration info according to an embodiment of the present disclosure.

FIG. 6C is a diagram illustrating a format of an FEC repair payload ID including FEC Configuration Info according to an embodiment of the present disclosure.

Referring to FIG. 6C, FEC Configuration Info may include # of packet_IDs, List of packet_IDs, source symbol block generation mode (SSBG_MODE), FEC Code Point, FEC Coding Structure, and Size of Repair Symbol as briefly described below. Although not illustrated, time information associated with a duration of an FEC source or repair packet block (e.g., a difference in time between the transmissions of a first source packet and a last source packet or the number of packets therebetween) is additionally included.

# of packet_IDs: the number of data streams included in a source packet block protected by the FEC repair packet;
List of packet_IDs: a list of packet_IDs that identifies data streams included in a source packet block protected by the FEC repair packet;
SSBG_MODE: a source symbol generation mode, SSBG_MODE0 or SSBG_MODE1;
FEC coding structure: a coding structure that is applied to a source packet block that is protected by the FEC repair packet, which may be classified as One Stage, Two Stage, and LA-FEC;
FEC code point: an FEC code used for generating the FEC repair packet; and
Size of repair symbol: a size of a repair symbol of a repair symbol block including the FEC repair packet.

Other information associated with the FEC repair payload ID is identical to the descriptions provided in FIG. 6B.

Figure 6D:
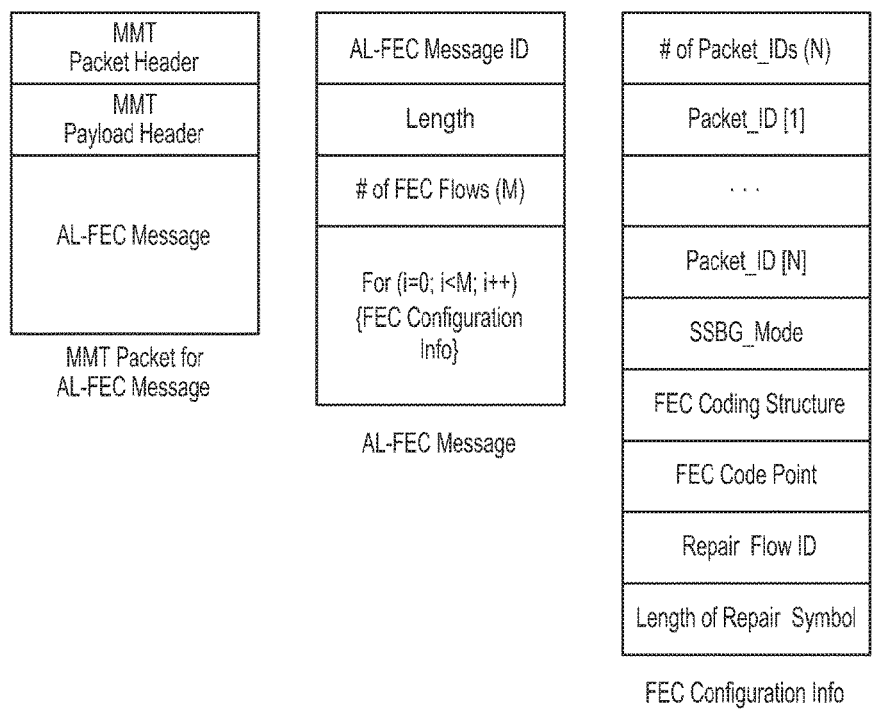
FIG. 6D is a diagram illustrating formats of an MMT packet for an AL-FEC message and an AL-FEC message that includes FEC configuration info according to an embodiment of the present disclosure.

FIG. 6D is a diagram illustrating formats of an MMT packet for an AL-FEC message and an AL-FEC message including FEC Configuration Info according to an embodiment of the present disclosure.

Referring to FIG. 6D, the FEC configuration info is identical to the descriptions of FIG. 6C. The AL-FEC message includes a message ID, a length field, # of FEC Flows, and FEC configuration info for each FEC flow.

Figure 7A:
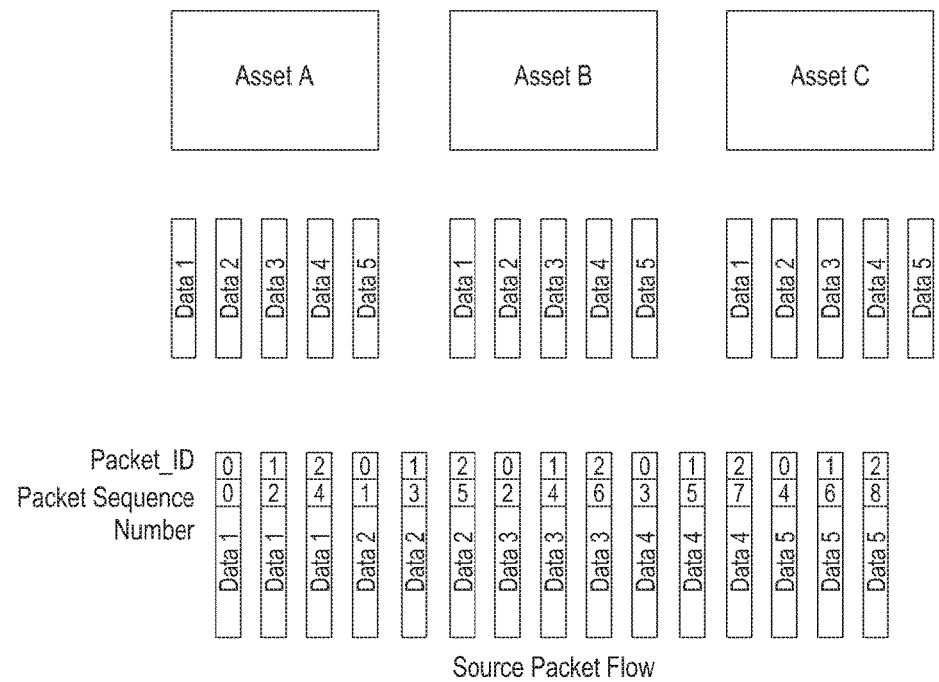
FIG. 7A is a diagram illustrating a method of configuring a source packet flow according to an embodiment of the present disclosure.

FIG. 7A is a diagram illustrating a method of generating a source packet flow according to an embodiment of the present disclosure.

Referring to FIG. 7A, when three assets A, B, and C (e.g., non-timed data or timed data, such as audio data, video data, text, file, and the like) exist, an MMT packet flow (source packet flow) is configured by dividing each asset into data of a certain size, and adding an MMT payload header and an MMT packet header to each data. Each of the assets A, B, and C are separated into five data payloads, and a header including a packet_ID and a packet sequence number is added to each data payload. Packet_ID=0 that identifies the packets of Asset A, packet_ID=1 that identifies the packets of Asset B, and packet_ID=2 that identifies the packets of Asset C, are assigned. A packet sequence number based on each packet_ID that increase by 1 is allocated. An MMT packet header is an example of the header.

Figure 7B:
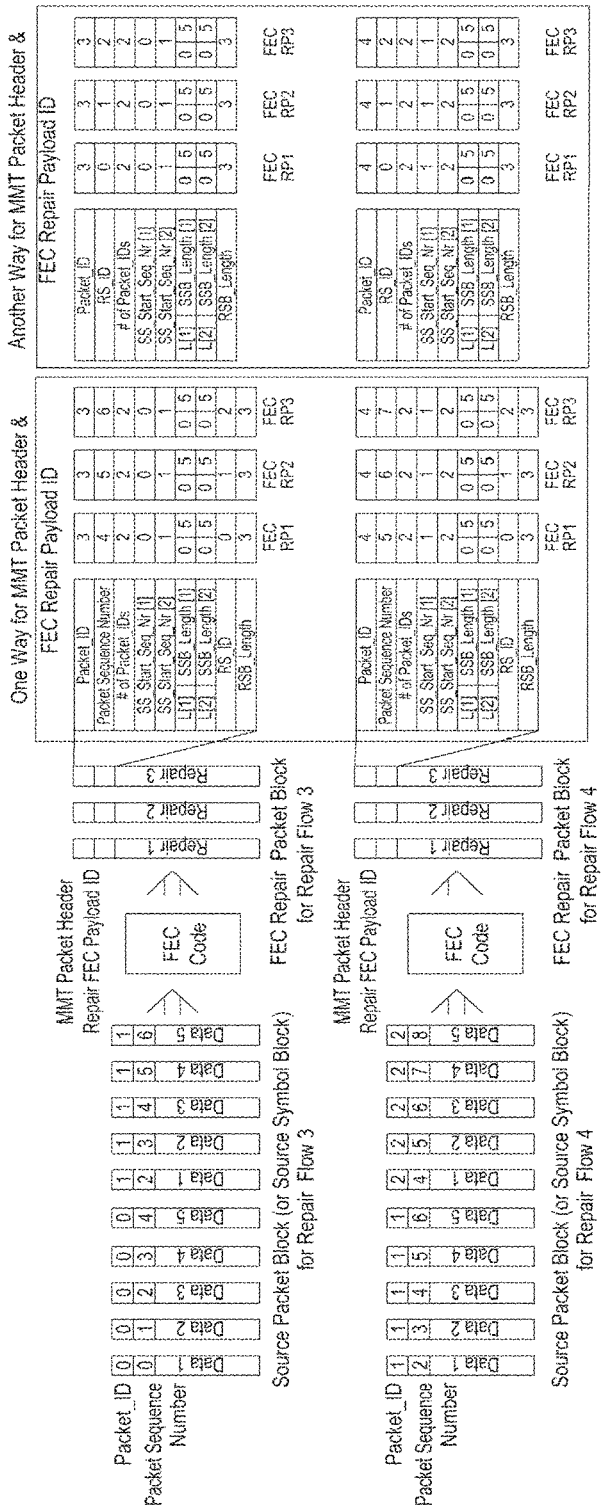
FIG. 7B is a diagram illustrating a method of configuring two FEC source packet flows from a source packet flow, and generating a repair flow for each FEC source packet flow, and an MMT packet header and an FEC repair payload ID, according to an embodiment of the present disclosure.

FIG. 7B is a diagram illustrating a method of configuring two FEC source packet flows from a source packet flow, and generating a repair flow for each FEC source packet flow, and an MMT packet header and an FEC repair payload ID, according to an embodiment of the present disclosure.

Referring to FIG. 7B, from the source packet flow generated in FIG. 7A, an FEC source packet flow 1 generates an FEC source packet block 1 (or source symbol block) formed of source packets generated from assets A and B, and an FEC source packet flow 2 generates an FEC source packet block 2 (source symbol block) formed of source packets generated from assets B and C, and each proceeds with FEC encoding. Accordingly, an FEC source packet block may be converted into a source symbol block based on one of the SSBG_MODEs provided in the descriptions with reference to FIG. 10. FEC encoding is performed thereto so that an FEC repair packets that transmit a repair symbol are generated. Information associated with an MMT payload header and an FEC repair payload ID of the FEC repair packet are described through the embodiment based on FIGS. 6A and 6B. Although not illustrated, under the assumption that the locations of source packets in a source packet block are determined based on an order of transmission when a source symbol block is generated from a source packet block, the location of a source symbol corresponding each source packet may be different in the source symbol block. Source symbols need to be arranged in a source symbol block based on the order of packet_IDs specified in the FEC repair payload ID of a repair packet. For example, in the case where a source packet block is formed of assets A and B, although source packets for asset A and asset B are mixed together in the source packet block, the source symbols for asset A need to be arranged first and then the source symbols for asset B need to be arranged in the source symbol block, or vice versa. Subsequently, the number of packet_IDs included in the source packet block (or source symbol block) and packet_IDs that are mapped to assets corresponding to a disposition sequence are listed in the FEC repair payload ID of the FEC repair packet. Alternatively, when a desired FEC source packet flow is configured from the source packet flow as illustrated in FIG. 7B, and each source packet block (or source symbol block) is configured, packets for asset A need to be arranged first in a source packet block (or source symbol block), and then, packets for asset B need to be arranged, and the number of packet_IDs and packet_IDs based on a disposition sequence are listed. Actually, a source packet flow is a stream of source packets based on an order of transmission. Accordingly, it is preferable that source packets, which correspond to a packet_ID of a source packet that is transmitted first out of the source packets for each source packet block, need to be arranged first in a source packet block (or source symbol block), and then, source packets corresponding to a subsequent packet_ID need to be arranged.

Figure 8A:
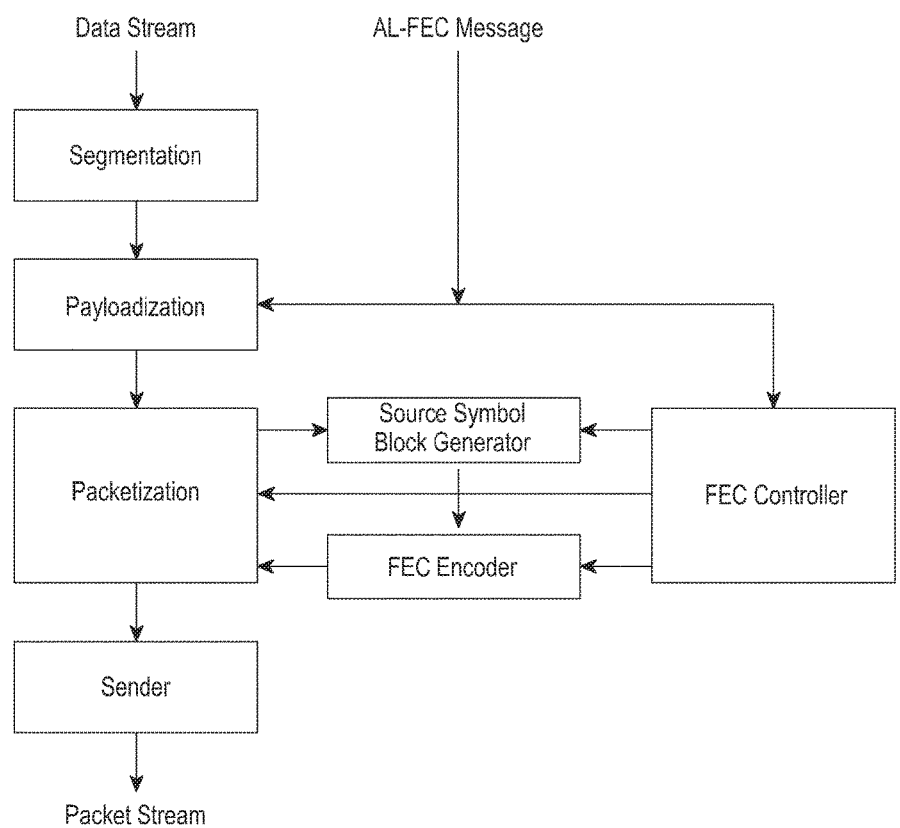
FIG. 8A is a block diagram illustrating a transmitter for packet protection according to an embodiment of the present disclosure.
Figure 8B:
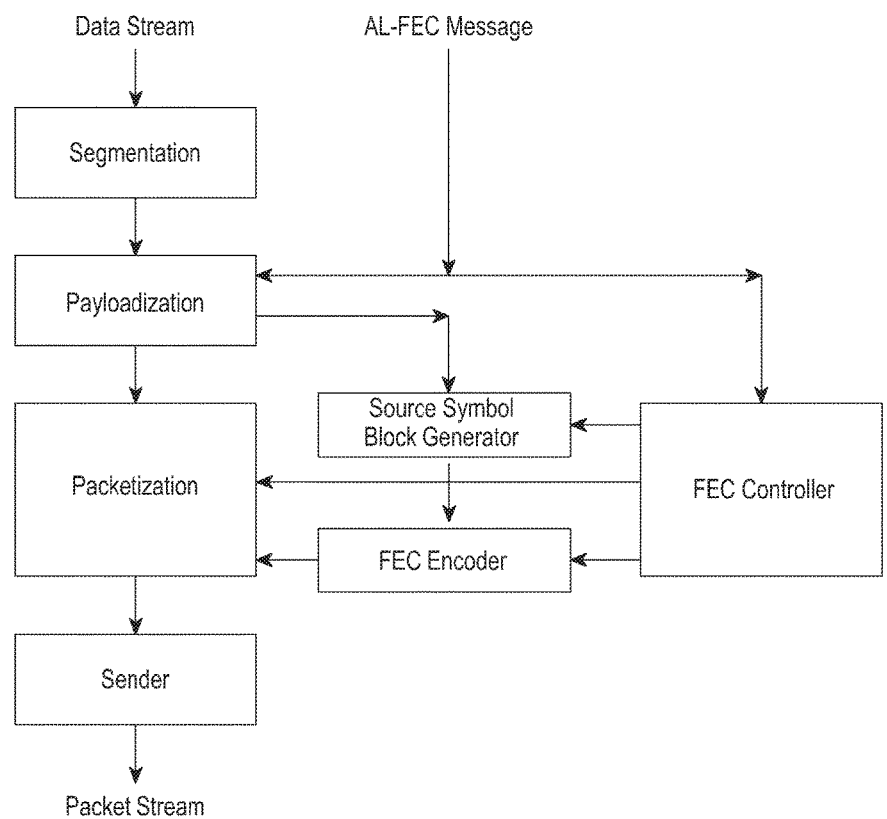
FIG. 8B is a block diagram illustrating a transmitter for payload protection according to an embodiment of the present disclosure.

FIGS. 8A and 8B are block diagrams illustrating a transmitter for packet protection and for payload protection according to an embodiment of the present disclosure.

Referring to FIGS. 8A and 8B, first, a data stream is processed through segmentation, payloadization, packetization, and is transmitted by a transmitter as a packet stream. An MMT may be assigned to, for example, data stream=asset. Segmentation divides data into data of a certain size. Payloadization adds a header to the data. Information that reconfigures the data from a packet received in a receiving end is stored in the header, which corresponds to, for example, an MMT payload. Packetization adds an MMT packet header to an MMT payload. The MMT packet header has a packet_ID and a packet sequent number, and thus, may be utilized for FEC.

When packet protection is performed, MMT packets, to which FEC protection is to be applied, may be input into a source symbol block generator under the control of an FEC controller. The source symbol block generator generates a source symbol block from MMT packets (source packets) (please refer to the example of FIG. 10), an FEC encoder receives a source symbol block and generates repair symbols, and each repair symbol is transmitted as an FEC repair packet, by adding an MMT packet header and an FEC repair payload ID thereto. Here, the MMT packet header and the FEC repair payload ID are formed of fields illustrated in FIGS. 6A, 6B, and 6C, according to the method.

The payload protection is identical to the previous descriptions, except that a source symbol block is input instead of an MMT payload or payload data.

After payloadization is performed, that is, after an MMT payload header is added, an MMT packet header is added, and the AL-FEC message is transmitted as a packet that is different from data.

Figure 9A:
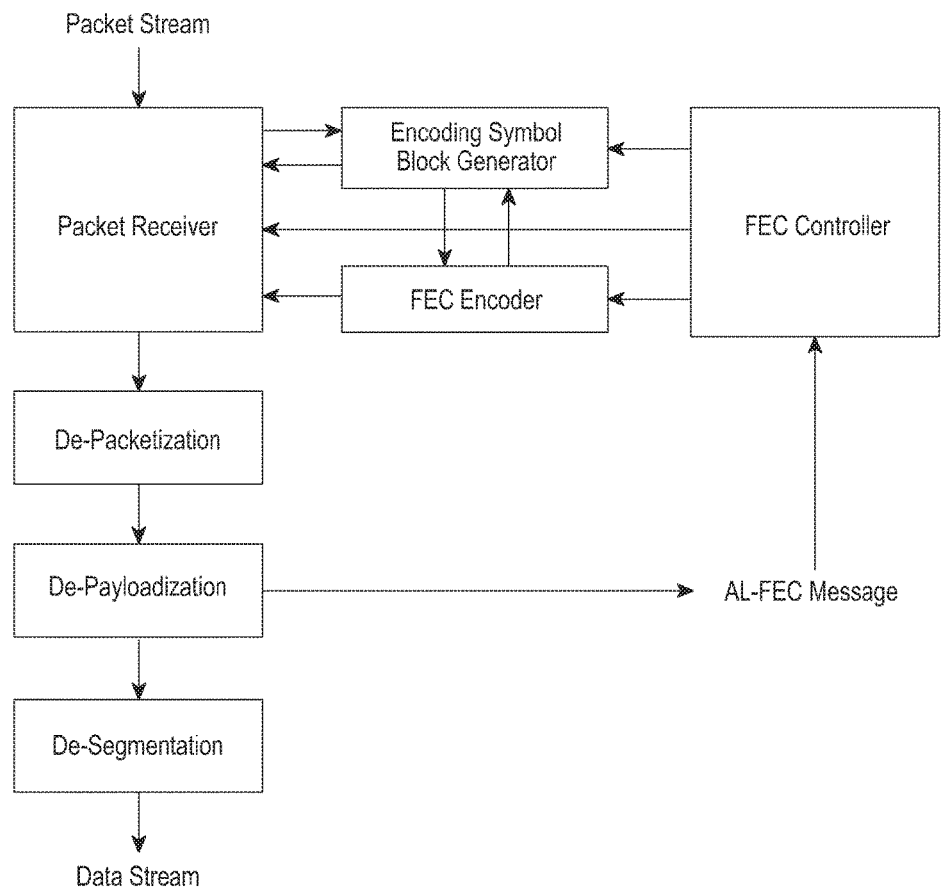
FIG. 9A is a block diagram illustrating a receiver for packet protection according to an embodiment of the present disclosure.
Figure 9B:
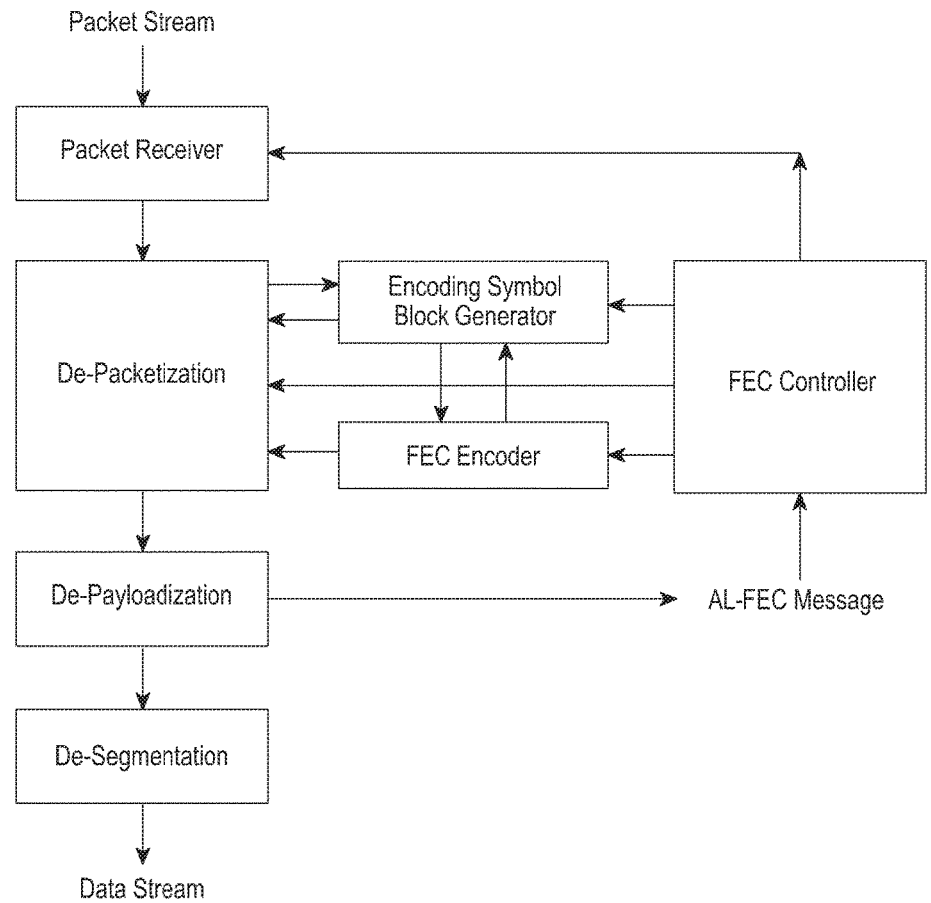
FIG. 9B is a block diagram illustrating a receiver for payload protection according to an embodiment of the present disclosure.

FIGS. 9A and 9B are block diagrams illustrating a receiver for packet protection and for payload protection according to an embodiment of the present disclosure.

Referring to FIGS. 9A and 9B, when a packet is received, it is determined whether the packet is a source packet or an FEC repair packet. When many types of source packets (e.g., when an MMT packet including a separate source symbol ID (SS_ID) (conventional disclosure) and an MMT packet that does not include a separate SS_ID (present disclosure) coexist) and may types of FEC repair packets (e.g., an FEC repair packet of the conventional disclosure and an FEC repair packet of the present disclosure coexist) coexist, information distinguishing the packets is included in an MMT packet header, and a receiver distinguishes each packet based on the same. Through de-packetization (e.g MMT De-packetization or Parse), de-payloadization (MMT payload depayloadization or parse), and de-segmentation, data stream is repaired again. When packet protection is applied, the operations of the receiver may recognize basic information associated with FEC configuration required for FEC decoding, from an AL-FEC message. When a received packet is a repair packet, the receiver recognizes: a repair symbol of the repair packet; a packet_ID included in an MMT packet header; # of packet_IDs, List of packet_IDs, List of SS_Start_Seq_Nrs, and List of SSB_Length[] listed in an FEC repair payload ID; and source packets protected by the corresponding repair packet from another information, and inputs a corresponding source packet (MMT packet) into a encoding symbol generator. The encoding symbol generator converts the source packet into a source symbol based on a given SSBG mode, and configures a repair symbol together with an encoding symbol block. An FED decoder repairs a lost source symbol using the repair symbol, obtains a source packet, and transmits the same to a de-packetization block.

Except for repairing a payload as opposed to a packet, payload protection is identical to packet protection from the perspective of utilizing information of an MMT packet header and information of an FEC repair payload ID of an FEC repair packet.

Figure 10:
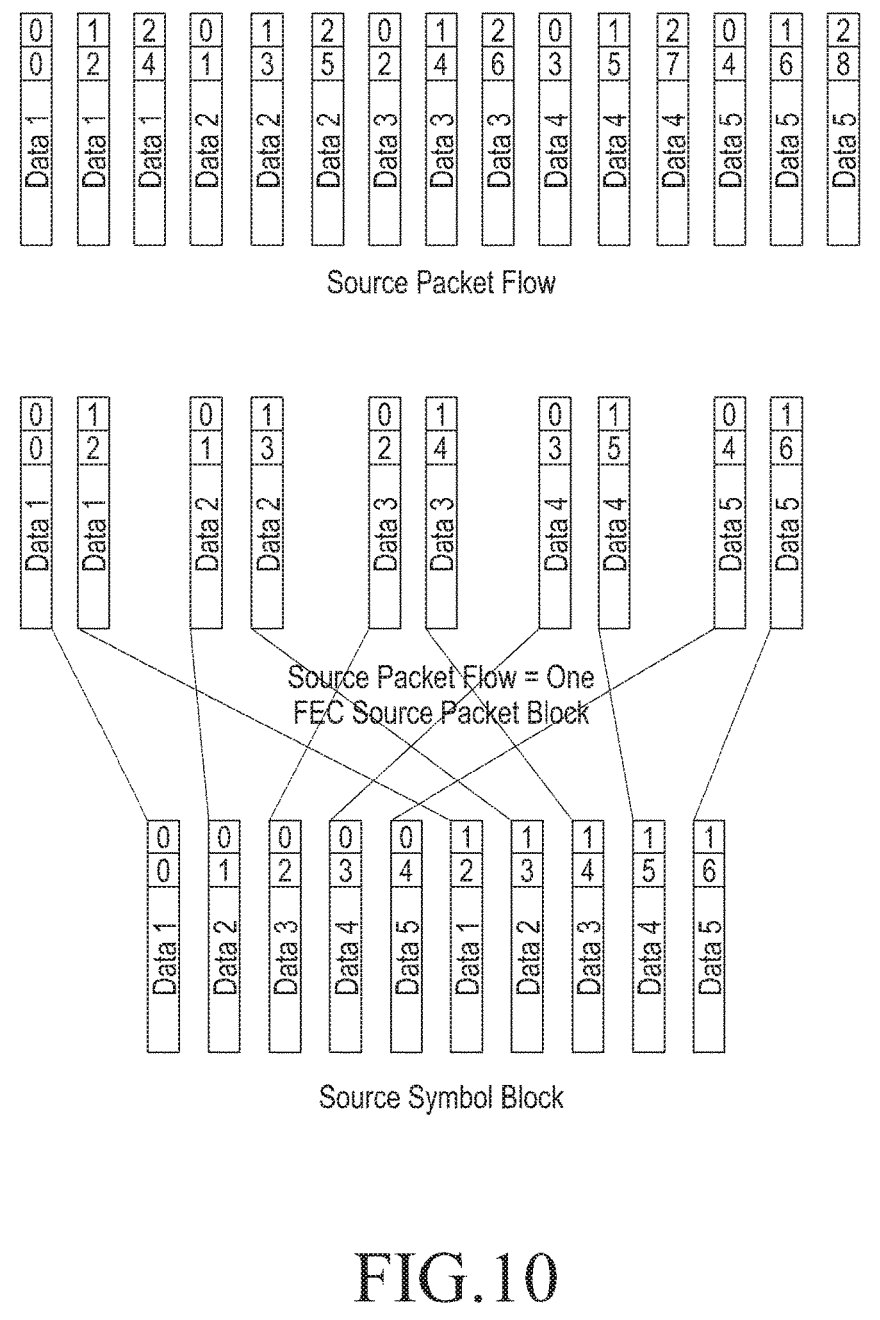

FIG. 10 is a flowchart illustrating operations of configuring a source symbol block according to an embodiment of the present disclosure.

Referring to FIG. 10, an operation of generating a source packet block (or source symbol block) according to an embodiment of the present disclosure is illustrated. An FEC source packet flow (=1 source packet block) is configured with packets corresponding to two packet_IDs, that is, packet_ID=0 or 1, which are selected from a flow of packets formed of three types of packet_IDs. A source symbol block is generated by arranging the packets having packet_ID=0 first, and then, arranging the packets having packet_ID=1. In the case where a source packet is converted into a source symbol, when the lengths of the source packets are different from each other, a padding is required (SSBG_MODE1). When the lengths of the source packets are identical, no padding is required (SSBG_MODE0).

As described above, the present disclosure may provide a high-quality service. According to embodiments of the present disclosure, a receiver distinguishes each data stream based on stream distinguishing information included in an FEC packet or control information that is different from that of a source packet; recognizes a repair stream generated for FEC protection of each data stream; smoothly performs FEC decoding; and generates a repair flow with respect to a certain number of data streams included in a generated source packet flow, without affecting a source packet.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. A method of transmitting forward error correction (FEC) repair packet in a broadcasting system, the method comprising:
    converting a source packet block comprising a plurality of packets into a source symbol block;
    generating a FEC repair packet by encoding the source symbol block using a FEC code; and
    transmitting the FEC repair packet to recover the source symbol block by a receiver,
    wherein the FEC repair packet comprises a packet header and a repair FEC payload identification (ID),
    wherein the packet header comprises information on a FEC type indicating a type of FEC scheme used for the encoding, a packet ID and a packet sequence number for distinguishing packets that comprise a same packet ID, and
    wherein a value of the packet sequence number starts from an arbitrary value and is incremented by one for each of the packets.

2. The method of claim 1, wherein, if the FEC type indicates a predetermined value, the repair FEC payload ID comprises:
    information on a sequence number indicating the lowest packet of at least one packet having the same packet ID in the source symbol block which is protected by the FEC repair packet, and
    information on the number of the at least one packet.

3. The method of claim 1, further comprising transmitting FEC configuration information including information indicating a coding structure applied for the source packet block.

* * * * *